US008872525B2

(12) United States Patent
Marakhtanov et al.

(10) Patent No.: US 8,872,525 B2
(45) Date of Patent: Oct. 28, 2014

(54) SYSTEM, METHOD AND APPARATUS FOR DETECTING DC BIAS IN A PLASMA PROCESSING CHAMBER

(75) Inventors: Alexei Marakhtanov, San Jose, CA (US); Rajinder Dhindsa, San Jose, CA (US); Ken Lucchesi, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 431 days.

(21) Appl. No.: 13/301,580

(22) Filed: Nov. 21, 2011

(65) Prior Publication Data

US 2013/0127476 A1    May 23, 2013

(51) Int. Cl.
*G01R 27/28* (2006.01)
*G01R 27/26* (2006.01)
*G01R 31/26* (2014.01)
*H01J 37/32* (2006.01)

(52) U.S. Cl.
CPC ..... *H01J 37/32532* (2013.01); *H01J 37/32568* (2013.01); *H01J 37/32706* (2013.01); *H01J 37/32577* (2013.01)
USPC ........................ 324/615; 324/686; 324/762.01

(58) Field of Classification Search
USPC ......... 324/615, 612, 600, 686, 658, 649, 713, 324/522, 555, 76.69, 76.11, 762.01; 361/86, 87; 702/57, 64, 127
See application file for complete search history.

(56) References Cited

U.S. PATENT DOCUMENTS

| | | | |
|---|---|---|---|
| 4,340,462 A | 7/1982 | Koch | |
| 5,183,990 A | 2/1993 | Enyedy | |
| 5,349,271 A | 9/1994 | van Os et al. | |
| 5,620,524 A | 4/1997 | Fan et al. | |
| 5,801,386 A * | 9/1998 | Todorov et al. | ............... 250/397 |
| 5,998,933 A | 12/1999 | Shun'ko | |
| 6,150,628 A | 11/2000 | Smith et al. | |
| 6,335,293 B1 | 1/2002 | Luo et al. | |
| 6,337,460 B2 | 1/2002 | Kelkar et al. | |

(Continued)

FOREIGN PATENT DOCUMENTS

| | | |
|---|---|---|
| EP | 1 155 164 B1 | 7/2010 |
| JP | 5166595 | 7/1993 |

(Continued)

OTHER PUBLICATIONS

PCT International Search Report—PCT/US2011/001175—dated Nov. 29, 2011 (2 pages).

(Continued)

*Primary Examiner* — Hoai-An D Nguyen
(74) *Attorney, Agent, or Firm* — Martine Penilla Group, LLP

(57) ABSTRACT

A system and method of measuring a self bias DC voltage on a semiconductor wafer in a plasma chamber includes generating a plasma between a top electrode and a top surface of an electrostatic chuck in a plasma chamber including applying one or more RF signals to one or both of the top electrode and electrostatic chuck. The wafer is supported on the top surface of an electrostatic chuck. The self bias DC voltage is developed on the wafer. A vibrating electrode is oscillated to produce a variable capacitance, the vibrating electrode is located in the electrostatic chuck. An electrical current is developed in a sensor circuit. An output voltage is measured across a sampling resistor in the sensor circuit, a second DC potential is applied to the vibrating electrode to nullify the output voltage. The second DC potential is equal to the self bias DC voltage on the wafer.

19 Claims, 4 Drawing Sheets

(56) References Cited

U.S. PATENT DOCUMENTS

| | | | |
|---|---|---|---|
| 6,361,645 B1* | 3/2002 | Schoepp et al. | 361/234 |
| 6,392,351 B1 | 5/2002 | Shun'ko | |
| 6,432,260 B1 | 8/2002 | Mahoney et al. | |
| 6,527,911 B1 | 3/2003 | Yen et al. | |
| 6,815,974 B1* | 11/2004 | Lagowski et al. | 324/750.15 |
| 6,825,618 B2 | 11/2004 | Pu et al. | |
| 6,855,906 B2 | 2/2005 | Brailove | |
| 6,872,259 B2 | 3/2005 | Strang | |
| 6,924,455 B1 | 8/2005 | Chen et al. | |
| 7,363,876 B2 | 4/2008 | Lai et al. | |
| 7,611,603 B2* | 11/2009 | Yamazawa | 156/345.44 |
| 8,056,503 B2 | 11/2011 | Kikuchi et al. | |
| 2001/0000104 A1 | 4/2001 | Li et al. | |
| 2001/0002582 A1 | 6/2001 | Dunham et al. | |
| 2001/0047760 A1 | 12/2001 | Moslehi | |
| 2003/0015965 A1 | 1/2003 | Godyak | |
| 2003/0071035 A1 | 4/2003 | Brailove | |
| 2003/0155075 A1* | 8/2003 | Yasui et al. | 156/345.28 |
| 2003/0188685 A1 | 10/2003 | Wang et al. | |
| 2004/0027781 A1 | 2/2004 | Hanawa et al. | |
| 2004/0047720 A1 | 3/2004 | Lerner et al. | |
| 2004/0175953 A1 | 9/2004 | Ogle | |
| 2005/0000655 A1 | 1/2005 | Wi | |
| 2005/0001556 A1 | 1/2005 | Hoffman et al. | |
| 2005/0115677 A1* | 6/2005 | Nagahata et al. | 156/345.47 |
| 2005/0160985 A1 | 7/2005 | Brcka | |
| 2005/0184670 A1 | 8/2005 | Lacoste et al. | |
| 2005/0194100 A1 | 9/2005 | Or et al. | |
| 2006/0065623 A1 | 3/2006 | Guiney et al. | |
| 2007/0081295 A1 | 4/2007 | Brillhart et al. | |
| 2007/0251642 A1 | 11/2007 | Bera et al. | |
| 2008/0020574 A1 | 1/2008 | Marakhtanov et al. | |
| 2008/0041820 A1 | 2/2008 | Tong et al. | |
| 2008/0173237 A1 | 7/2008 | Collins et al. | |
| 2008/0179007 A1 | 7/2008 | Collins et al. | |
| 2008/0286697 A1 | 11/2008 | Verhaverbeke et al. | |
| 2008/0302652 A1 | 12/2008 | Entley et al. | |
| 2009/0025879 A1 | 1/2009 | Rauf et al. | |
| 2009/0066315 A1 | 3/2009 | Hu et al. | |
| 2009/0109595 A1 | 4/2009 | Herchen et al. | |
| 2009/0200268 A1 | 8/2009 | Tappan et al. | |
| 2009/0200269 A1 | 8/2009 | Kadkhodayan et al. | |
| 2009/0242135 A1 | 10/2009 | Koshimizu et al. | |
| 2009/0272492 A1 | 11/2009 | Katz et al. | |
| 2009/0277585 A1 | 11/2009 | Maebashi et al. | |
| 2009/0305509 A1 | 12/2009 | Stevenson et al. | |
| 2009/0321019 A1 | 12/2009 | Chen et al. | |
| 2009/0321391 A1* | 12/2009 | Ichino et al. | 216/61 |
| 2010/0008016 A1 | 1/2010 | Onate et al. | |
| 2010/0065215 A1 | 3/2010 | Jeon et al. | |
| 2010/0072172 A1 | 3/2010 | Ui et al. | |
| 2010/0116788 A1 | 5/2010 | Singh et al. | |
| 2010/0116790 A1 | 5/2010 | Spitzl | |
| 2010/0140223 A1 | 6/2010 | Tyler et al. | |
| 2010/0147050 A1 | 6/2010 | Barth | |
| 2010/0319852 A1 | 12/2010 | Brillhart et al. | |
| 2011/0061687 A1 | 3/2011 | Mikhaylichenko et al. | |
| 2011/0075313 A1 | 3/2011 | Comendant | |
| 2011/0108524 A1 | 5/2011 | Dhindsa et al. | |

FOREIGN PATENT DOCUMENTS

| | | |
|---|---|---|
| JP | 5144594 | 11/1993 |
| RU | 2022917 | 11/1994 |
| RU | 2056702 | 3/1996 |
| RU | 2094961 | 10/1997 |
| WO | WO 01 36703 A1 | 5/2001 |

OTHER PUBLICATIONS

PCT International Search Report—PCT/US2011/001174 dated Dec. 6, 2011 (2 pages).

PCT International Search Report—PCT/US2011/001176—dated Jan. 19, 2012 (4 pages).

PCT International Search Report—PCT/US2012/065333—(dated Jan. 28, 2013) (3 pages).

PCT International Search Report—PCT/US2012/063987(dated Jan. 28, 2013) (3 pages).

PCT International Search Report—PCT/US2012/065080(dated Jan. 28, 2013) (2 pages).

PCT International Search Report—PCT/US2012/065684 (dated Jan. 28, 2013) (2 pages).

PCT International Search Report—PCT/US2012/65949(dated Feb. 5, 2013 (2 pages_.

PCT International Search Report—PCT/US2012/065677(dated Feb. 7, 2013 (3 pages).

PCT International Search Report—PCT/US2012/66467(dated Feb. 8, 2013) (2 pages).

PCT International Search Report—PCT/US2012/65122—(dated Mar. 25, 2013) (2 pages).

* cited by examiner

SYSTEM, METHOD AND APPARATUS FOR DETECTING DC BIAS IN A PLASMA PROCESSING CHAMBER

BACKGROUND

The present invention relates generally to plasma processing chambers, and more particularly, to systems, methods and apparatus for accurately detecting the actual DC bias on a substrate being processed.

Plasma processing is very common in manufacturing semiconductors. Plasma processing is typically a plasma etch process where plasma ions produced in the plasma react with an exposed layer of the substrate. The depth the plasma ions can penetrate into the exposed layer of the substrate is determined by the energy of the plasma ions. The energy of the plasma ions is at least partially related to the bias applied to the substrate.

Ever higher aspect ratios of depth/width are sought as semiconductor device sizes become smaller and more densely packed. The higher aspect ratios require plasma ions with an increased energy level.

One approach to increasing the energy of the plasma ions is to increase the bias voltage. Unfortunately, as the bias voltage increases, arcing occurs between the substrate and the processing chamber and between the electrodes and the processing chamber structures. Further, even relatively small intrusions into the biased region of the substrate or the plasma electromagnetic field can cause significant disruption of the respective electrical fields and thus cause localized plasma ion energy fluctuations. Thus resulting in localized non-uniformities in the plasma etch process.

The typical method and structure used to detect the DC bias of the substrate is a contact pin. However, the contact pin disrupts the electromagnetic field of the substrate or the plasma electromagnetic field. Also, as the bias levels increase, arcing can occur between the substrate and the contact pin. This arcing can damage the contact pin and distort the detected level of the actual DC bias present.

In view of the foregoing, there is a need for a system, method and apparatus for more accurately measuring the DC bias without causing corresponding, localized non-uniformities in the plasma etch process.

SUMMARY

Broadly speaking, the present invention fills these needs by providing a system, method and apparatus for more accurately measuring the DC bias without causing corresponding, localized non-uniformities in the plasma etch process. It should be appreciated that the present invention can be implemented in numerous ways, including as a process, an apparatus, a system, computer readable media, or a device. Several inventive embodiments of the present invention are described below.

One embodiment provides a method of measuring a self bias DC voltage on a semiconductor wafer in a plasma chamber includes generating a plasma in the region between a top electrode and a top surface of an electrostatic chuck in a plasma chamber including applying one or more RF signals to one or both of the top electrode and the electrostatic chuck. The semiconductor wafer is supported on the top surface of an electrostatic chuck. The self bias DC voltage is developed on the semiconductor wafer. A vibrating electrode is oscillated to produce a variable capacitance, the vibrating electrode being located within the electrostatic chuck, An electrical current is developed in a sensor circuit connected to the vibrating electrode. An output voltage is measured across a sampling resistor in the sensor circuit and a second DC potential is applied to the vibrating electrode to nullify the output voltage. The second DC potential is equal to the self bias DC voltage on the semiconductor wafer.

Oscillating the vibrating electrode can include oscillating the vibrating electrode at a frequency of between less than about 10 Hz and more than about 100 Hz. The vibrating electrode can include oscillating the vibrating electrode at an amplitude of between less than about 0.05 mm and more than about 3.0 mm.

The vibrating electrode can be separated from the top surface of the electrostatic chuck by a non-conductive layer. The vibrating electrode can be separated from the top surface of the electrostatic chuck by a ceramic layer.

The vibrating electrode can be located under a portion of the top surface of the electrostatic chuck supporting the semiconductor wafer. The vibrating electrode can be substantially centered under the portion of the top surface of the electrostatic chuck supporting the semiconductor wafer.

The vibrating electrode can be located under a portion of the top surface of the electrostatic chuck not supporting the semiconductor wafer. The electrostatic chuck can include an edge ring and the vibrating electrode can be located under a portion of the edge ring.

Another embodiment provides a method of measuring a self bias DC voltage on a semiconductor wafer in a plasma chamber including generating a plasma in the region between a top electrode and a ceramic layer of a top surface of an electrostatic chuck in a plasma chamber including applying one or more RF signals to one or both of the top electrode and the electrostatic chuck. The semiconductor wafer is supported on the ceramic layer of the top surface of an electrostatic chuck. The self bias DC voltage is developed on the semiconductor wafer. A vibrating electrode is oscillated at a frequency of between less than about 10 Hz and more than about 100 Hz to produce a variable capacitance, the vibrating electrode being located within the electrostatic chuck and separated from the semiconductor wafer by the ceramic layer. An electrical current is developed in a sensor circuit connected to the vibrating electrode. An output voltage is measured across a sampling resistor in the sensor circuit. A second DC potential is applied to the vibrating electrode to nullify the output voltage, the second DC potential is equal to the self bias DC voltage on the semiconductor wafer.

Yet another embodiment provides a system for measuring a self bias DC voltage on a semiconductor wafer in a plasma chamber. The plasma chamber includes a top electrode, an electrostatic chuck for supporting a semiconductor wafer and a vibrating electrode inside the electrostatic chuck. The system also includes at least one RF source coupled to at least on of the top electrode and the electrostatic chuck, a sensing circuit connected to the vibrating electrode, a process gas source and a controller coupled to the at least one RF source and the plasma chamber.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings.

DETAILED DESCRIPTION

Several exemplary embodiments for a system, method and apparatus for more accurately measuring the DC bias without causing corresponding, localized non-uniformities in the plasma etch process will now be described. It will be apparent to those skilled in the art that the present invention may be practiced without some or all of the specific details set forth herein.

A variable capacitance to the surface of the electrostatic chuck can be used as an accurate, non-contact DC bias measuring system. The capacitance can be varied by varying the distance between the plates that form the capacitor at a known amount and at a known frequency. A detected current flow through the variable capacitance can be used to calculate the DC bias on the surface of the electrostatic chuck, thus providing a non-contact system and method for measuring the DC bias.

Figure 1:
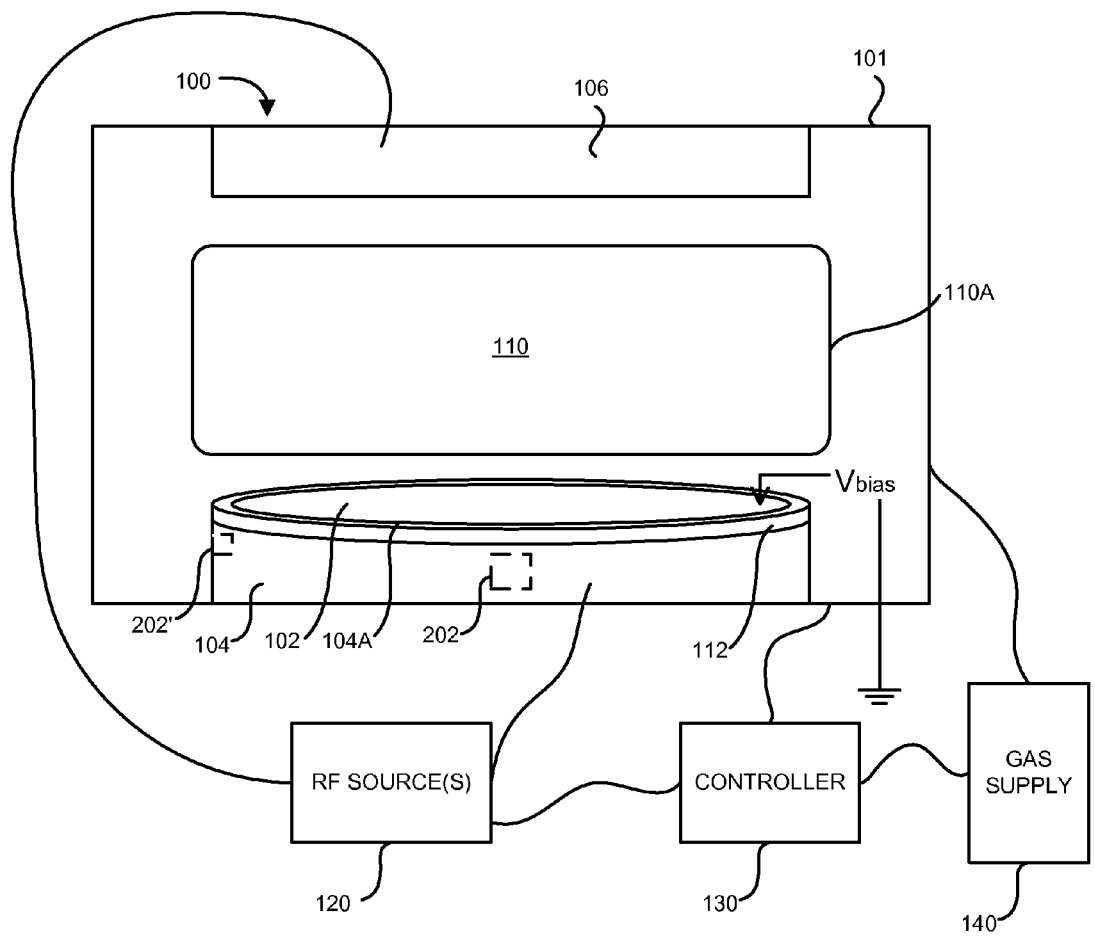
FIG. 1 is a block diagram of a plasma chamber system, in accordance with embodiments of the present invention.

FIG. 1 is a block diagram of a plasma chamber system 100, in accordance with embodiments of the present invention. The plasma chamber system 100 includes a plasma chamber 101, an electro-static chuck (ESC) 104, an edge ring 112 in the top surface of the ESC 104, and a top electrode 106. The top electrode 106 and the ESC 104 can be coupled to one or more respective RF signal sources 120 or ground potentials as desired for the specific process. A process gas supply 140 is also coupled to the plasma chamber 101.

A controller 130 is also coupled to the plasma chamber 101 and the one or more RF signal sources 120 and the process gas supply 140. The controller 130 includes software, logic, memory systems, input and output systems to monitor control the system 100 according to a desired recipe or process. The input and output systems include user interface systems for interacting with a user. The input and output systems also include networking protocols for communicating data to and from other computer systems and peripherals (e.g., displays, printers, remote storage and other input and output devices). The controller 130 can be a standard, i.e., generic computer, or a suitable specialized computer for the specific application.

The electro-static chuck (ESC) 104 is capable of supporting and securing a semiconductor wafer 102 thereon. The one or more RF signal sources 120 can also include one or more DC bias sources.

A vibrating electrode 202 is located under or within the ceramic layer 104A of electrostatic chuck (ESC) 104. In an alternative implementation the vibrating electrode 202' can be located under the surface of an edge ring 112.

The vibrating electrode 202 is physically separated from the ESC 104 by spaces S1, S2. The spaces S1, S2 can be between about 0.5 mm and about 5.0 mm.

Figure 2A:
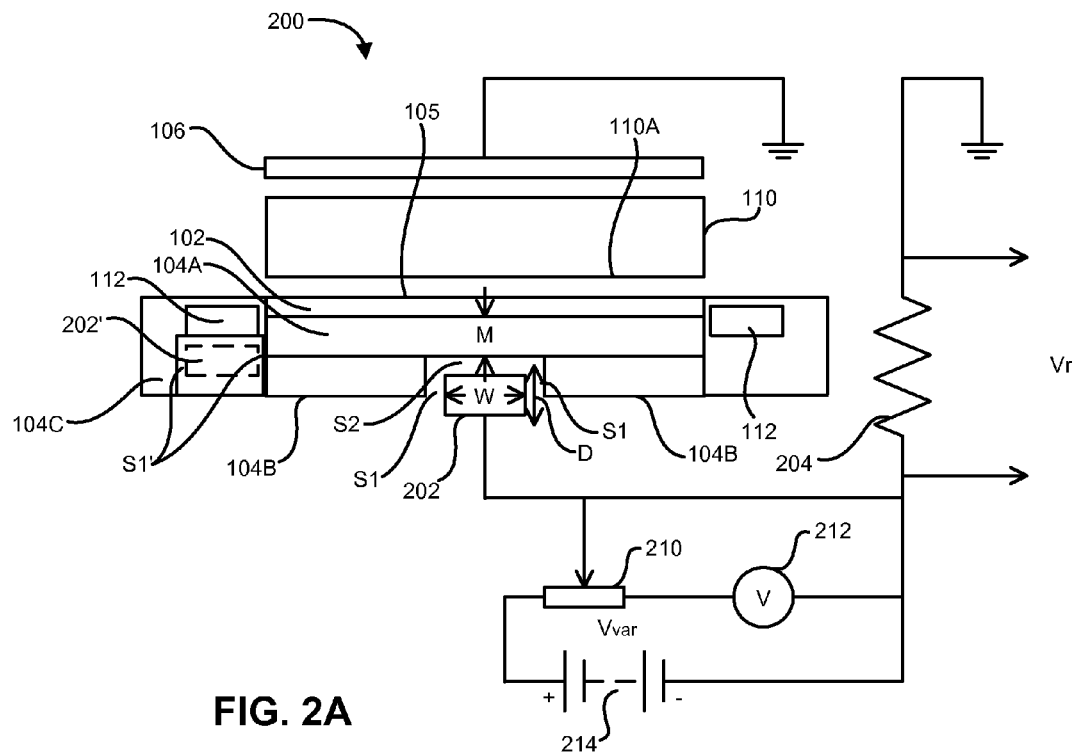
FIG. 2A is a block diagram of a bias voltage detecting circuit, in the plasma chamber, in accordance with embodiments of the present invention.
Figure 2B:
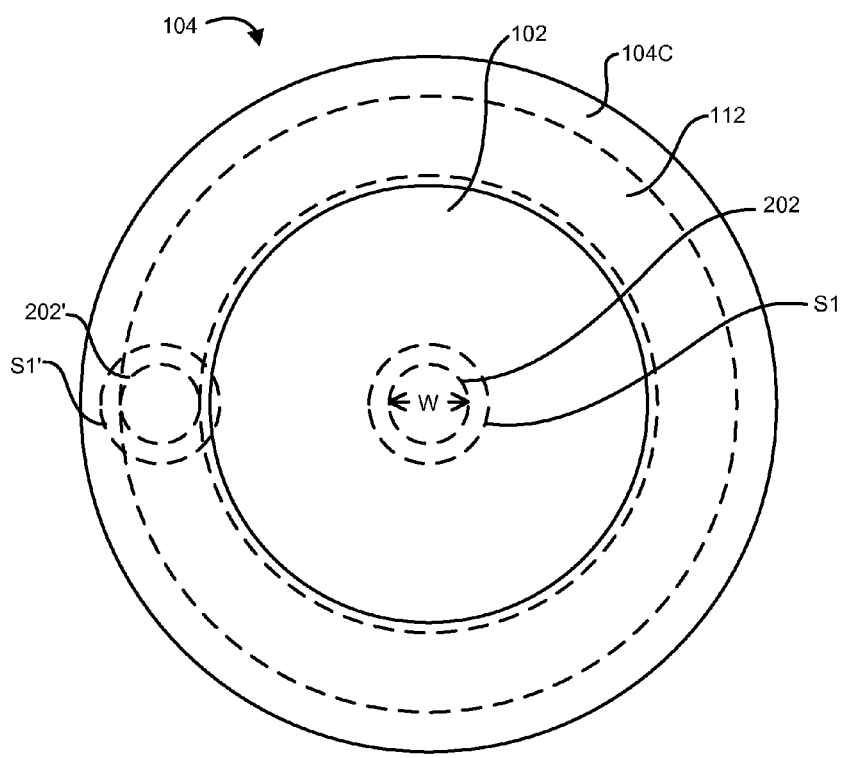
FIG. 2B is a top view of the electrostatic chuck, in the plasma chamber, in accordance with embodiments of the present invention.

FIG. 2A is a block diagram of a bias voltage detecting circuit 200, in the plasma chamber 100, in accordance with embodiments of the present invention. FIG. 2B is a top view of the electrostatic chuck 104, in the plasma chamber 100, in accordance with embodiments of the present invention. The vibrating electrode 202 can be substantially centered in the electrostatic chuck 104 or offset toward an edge or further offset in a position 202' under an edge ring 112. A top surface of the vibrating electrode 202 is substantially flat and in a plane parallel to the ceramic surface 105 of the electrostatic chuck 104.

The vibrating electrode 202 has a width of between about 2.0 mm and about 15.0 mm. The vibrating electrode 202 can be any suitable shape. A rounded shape can reduce the possibility of the vibrating electrode arcing. The vibrating electrode 202 is spaced away from the adjacent structures by spaces S1, S1', S2. The vibrating electrode 202 can vibrate or oscillate an amplitude D. The vibrating electrode 202 is separated from the semiconductor wafer 102 by a non-conductive layer 104A. The non-conductive layer 104A between the vibrating electrode 202 and the semiconductor wafer 102 has a thickness M of between about 1.0 mm and about 5 mm.

Figure 3:
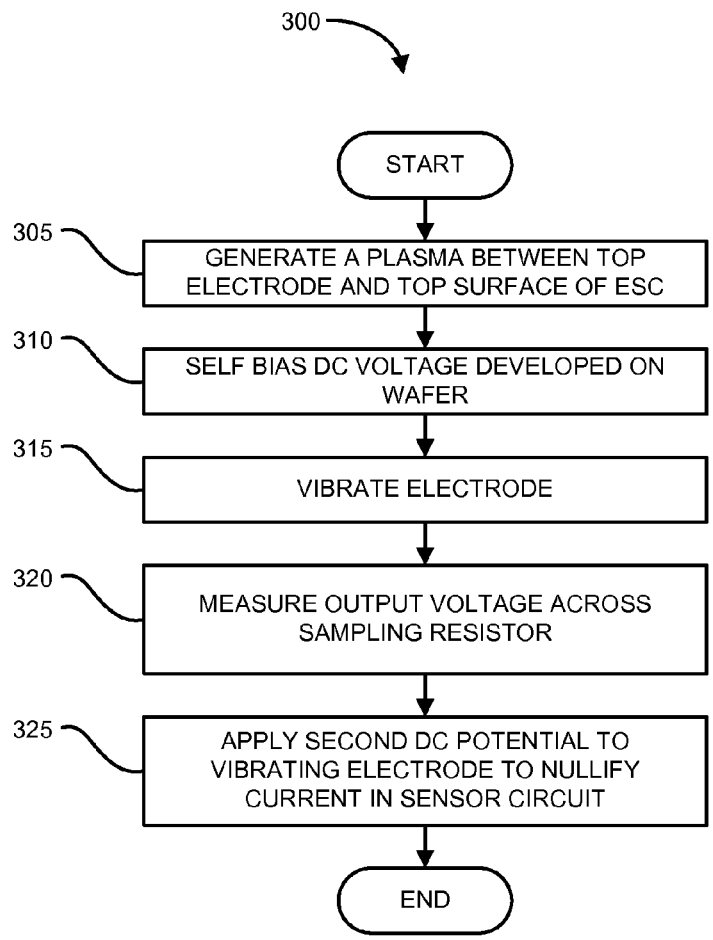
FIG. 3 is a flowchart diagram that illustrates the method operations performed in measuring the self bias DC voltage, in accordance with embodiments of the present invention.

FIG. 3 is a flowchart diagram that illustrates the method operations 300 performed in measuring the self bias DC voltage, in accordance with embodiments of the present invention. The operations illustrated herein are by way of example, as it should be understood that some operations may have sub-operations and in other instances, certain operations described herein may not be included in the illustrated operations. With this in mind, the method and operations 300 will now be described.

In an operation 305, one or more RF signals are applied to one or both of the top electrode 106 and the electrostatic chuck 104 to generate a plasma 110 in the region between the top electrode 106 and the top surface 105 of the electrostatic chuck. In an operation 310, a self DC bias voltage (Vbias) is developed on the semiconductor wafer 102. A DC bias voltage Vbias is the DC potential measured of semiconductor wafer 202 with respect to ground.

In an operation 315, the vibrating electrode 202 oscillates with amplitude D of between less than about 0.05 mm and more than about 3.0 mm and with a frequency f of between less than about 10 Hz and more than about 100 Hz. The frequency f is low enough to not substantially couple with the RF signal applied to the electrostatic chuck 104. The vibrating electrode varies the capacitance between itself and ceramic layer 104A of the electrostatic chuck 104. The top surface 105 of the ceramic layer 104A of the electrostatic chuck 104 is charged by the DC biased substrate 102 sitting on the top surface of the ceramic layer of the electrostatic chuck (i.e., on the opposite side of the ceramic layer 104A from the vibrating electrode 202).

In an operation 320, the variation of capacitance AC develops an electrical current in the sensor circuit and which can be measured as an output voltage Vr across a sampling resistor 204. The sampling resistor 204 is a relatively high resistance (e.g., greater than 1 megaohm and as high as 100 megaohm) to help block the RF signals from being conducted through the resistor 204. The value of Vvar, when circuit current is zero, will be equal to Vbias developed on the semiconductor wafer 102.

In an operation 325, a second DC potential Vvar can be applied to vibrating electrode 202 to compensate for the charge on the ceramic surface 105 and nullify current in the sensor circuit as determined by a zero output voltage across the sampling resistor 204. The method operations can then end. The second DC potential Vvar is equal to the DC self bias voltage on the semiconductor wafer 102.

The circuit 200 provides dynamic, insitu measurement of wafer DC self bias voltage on the semiconductor wafer 102 with a high accuracy and without physically touching the semiconductor wafer 102 or interfering with the plasma electronic field. The second DC bias voltage (Vbias) can vary as the RF signals interfere constructively and destructively with each other.

In an exemplary implementation the vibrating electrode 202 width W is 10 mm and oscillates with amplitude D of 0.2 mm at a frequency f of 20 Hz. The variable capacitance of the capacitor formed by the vibrating electrode 202 to ceramic layer 104A can be used to measure the DC bias voltage (Vbias) as follows:

$$q = C\phi$$

$$I = q = \phi[dC/dt]$$

$$Vr = Rq = R\phi[dC/dt]$$

$$\Delta C = \epsilon_0 A/\Delta d$$

Where q is the charge on the capacitor formed by the vibrating electrode 202 to electrostatic chuck 104. C is the capacitance of the capacitor formed by the vibrating electrode 202 to electrostatic chuck 104. $\phi$ is wafer DC self bias voltage (e.g., 100v). I is the current. dC is the derivative of C. dt is the derivative of time. Vr is the output voltage across sampling resistor 204. R is the resistance of the sampling resistor 204 (e.g., 20 megaohms). AC is the change in capacitance of the capacitor formed by the vibrating electrode 202 to electrostatic chuck 104. $\epsilon_0 A$ is the air gap dielectric constant times an area of the vibrating electrode 202. AD is the variation in amplitude D.

Thus the relationships above can be resolved as follows:

$$I = \phi[dC/dt] = 100 \times [3.47 \times 10^{-12}/0.05] = 6.94 \text{ nA}$$

With R=20 megaohms then voltage Vr across resistor 204 equals 0.139 v

Figure 4:
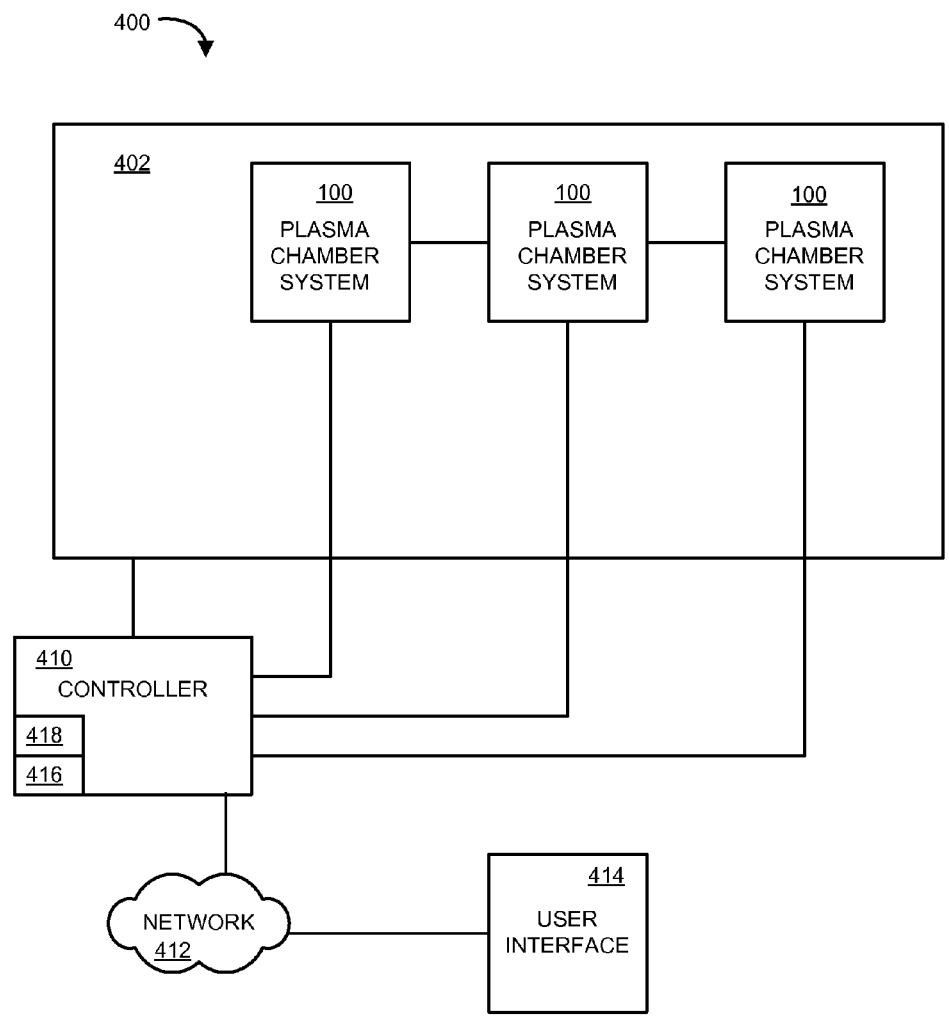
FIG. 4 is a block diagram of an integrated system including one or more of the plasma chamber systems, in accordance with embodiments of the present invention.

FIG. 4 is a block diagram of an integrated system 400 including one or more of the plasma chamber systems 100, in accordance with embodiments of the present invention. The integrated system 400 includes the one or more of the plasma chamber systems 100, and an integrated system controller 410 coupled to the plasma chamber(s) in a single factory 402. The integrated system controller 410 includes or is coupled to (e.g., via a wired or wireless network 412) a user interface 414. The user interface 414 provides user readable outputs and indications and can receive user inputs and provides user access to the integrated system controller 410.

The integrated system controller 410 can include a special purpose computer or a general purpose computer. The integrated system controller 410 can execute computer programs 416 to monitor, control and collect and store data 418 (e.g., performance history, analysis of performance or defects, operator logs, and history, etc.) for the plasma chamber system(s) 100. By way of example, the integrated system controller 410 can adjust the operations of the plasma chamber system(s) and/or the components therein (e.g., pressures, flow rates, bias signals, loading and unloading of the substrate 102, etc.) if data collected dictates an adjustment to the operation thereof.

With the above embodiments in mind, it should be understood that the invention may employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing.

The invention can also be embodied as computer readable code on a computer readable medium. The computer readable medium is any data storage device that can store data, which can thereafter be read by a computer system. Examples of the computer readable medium include hard drives, network attached storage (NAS), read-only memory, random-access memory, CD-ROMs, CD-Rs, CD-RWs, DVDs, Flash, magnetic tapes, and other optical and non-optical data storage devices. The computer readable medium can also be distributed over a network coupled computer systems so that the computer readable code is stored and executed in a distributed fashion.

It will be further appreciated that the instructions represented by the operations in the above figures are not required to be performed in the order illustrated, and that all the processing represented by the operations may not be necessary to practice the invention. Further, the processes described in any of the above figures can also be implemented in software stored in any one of or combinations of the RAM, the ROM, or the hard disk drive.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A method of measuring a self bias DC voltage on a semiconductor wafer in a plasma chamber comprising:
    generating a plasma in the region between a top electrode and a top surface of an electrostatic chuck in a plasma chamber including applying one or more RF signals to one or both of the top electrode and the electrostatic chuck, wherein the semiconductor wafer is supported on the top surface of an electrostatic chuck;
    developing the self bias DC voltage on the semiconductor wafer;
    oscillating a vibrating electrode to produce a variable capacitance, the vibrating electrode being located within the electrostatic chuck;
    developing an electrical current in a sensor circuit connected to the vibrating electrode;
    measuring an output voltage across a sampling resistor in the sensor circuit; and
    applying a second DC potential to the vibrating electrode to nullify the output voltage; wherein the second DC potential is equal to the self bias DC voltage on the semiconductor wafer.

2. The method of claim 1, wherein oscillating the vibrating electrode includes oscillating the vibrating electrode at a frequency of between less than about 10 Hz and more than about 100 Hz.

3. The method of claim 1, wherein oscillating the vibrating electrode includes oscillating the vibrating electrode at an amplitude of between less than about 0.05 mm and more than about 3.0 mm.

4. The method of claim 1, wherein the vibrating electrode is separated from the top surface of the electrostatic chuck by a non-conductive layer.

5. The method of claim 1, wherein the vibrating electrode is located under a portion of the top surface of the electrostatic chuck supporting the semiconductor wafer.

6. The method of claim 5, wherein the vibrating electrode is substantially centered under a portion of the top surface of the electrostatic chuck supporting the semiconductor wafer.

7. The method of claim 1, wherein the vibrating electrode is located under a portion of the top surface of the electrostatic chuck not supporting the semiconductor wafer.

8. The method of claim 1, wherein the electrostatic chuck includes an edge ring and wherein the vibrating electrode is located under a portion of the edge ring.

9. The method of claim 1, wherein the vibrating electrode is separated from the top surface of the electrostatic chuck by a ceramic layer.

10. A method of measuring a self bias DC voltage on a semiconductor wafer in a plasma chamber comprising:
   generating a plasma in the region between a top electrode and a ceramic layer of a top surface of an electrostatic chuck in a plasma chamber including applying one or more RF signals to one or both of the top electrode and the electrostatic chuck, wherein the semiconductor wafer is supported on the ceramic layer of the top surface of an electrostatic chuck;
   developing the self bias DC voltage on the semiconductor wafer;
   oscillating a vibrating electrode at a frequency of between less than about 10 Hz and more than about 100 Hz to produce a variable capacitance, the vibrating electrode being located within the electrostatic chuck and separated from the semiconductor wafer by the ceramic layer;
   developing an electrical current in a sensor circuit connected to the vibrating electrode;
   measuring an output voltage across a sampling resistor in the sensor circuit; and
   applying a second DC potential to the vibrating electrode to nullify the output voltage; wherein the second DC potential is equal to the self bias DC voltage on the semiconductor wafer.

11. A system for measuring a self bias DC voltage on a semiconductor wafer in a plasma chamber comprising:
   a plasma chamber including:
      a top electrode;
      an electrostatic chuck for supporting a semiconductor wafer; and
      a vibrating electrode oscillates inside the electrostatic chuck;
   at least one RF source coupled to at least one of the top electrode and the electrostatic chuck;
   a sensing circuit connected to the vibrating electrode, wherein said sensing circuit comprises a sampling resistor for measuring an output voltage;
   a process gas source; and
   a controller coupled to the at least one RF source and the plasma chamber.

12. The system of claim 11, wherein the vibrating electrode is capable of oscillating at an amplitude of between less than about 0.05 mm and more than about 3.0 mm.

13. The system of claim 11, wherein the vibrating electrode is separated from the top surface of the electrostatic chuck by a non-conductive layer.

14. The system of claim 11, wherein the vibrating electrode is separated from the top surface of the electrostatic chuck by a ceramic layer.

15. The system of claim 11, wherein the vibrating electrode is located under a portion of the top surface of the electrostatic chuck supporting the semiconductor wafer.

16. The system of claim 15, wherein the vibrating electrode is substantially centered under a portion of the top surface of the electrostatic chuck supporting the semiconductor wafer.

17. The system of claim 11, wherein the vibrating electrode is located under a portion of the top surface of the electrostatic chuck not supporting the semiconductor wafer.

18. The system of claim 11, wherein the electrostatic chuck includes an edge ring and wherein the vibrating electrode is located under a portion of the edge ring.

19. The system of claim 11, wherein the vibrating electrode is capable of oscillating at a frequency of between less than about 10 Hz and more than about 100 Hz.

* * * * *